(12) United States Patent
Yang et al.

(10) Patent No.: US 11,804,843 B2
(45) Date of Patent: Oct. 31, 2023

(54) SELECTION CIRCUIT AND METHOD FOR CONTROLLING THE SAME, AND MULTIPLEXING CIRCUIT

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Tong Yang, Beijing (CN); Xianjie Shao, Beijing (CN); Tingting Zhao, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 239 days.

(21) Appl. No.: 17/309,849

(22) PCT Filed: Dec. 29, 2020

(86) PCT No.: PCT/CN2020/140838
§ 371 (c)(1),
(2) Date: Jun. 23, 2021

(87) PCT Pub. No.: WO2021/136267
PCT Pub. Date: Jul. 8, 2021

(65) Prior Publication Data
US 2022/0311442 A1    Sep. 29, 2022

(30) Foreign Application Priority Data

Jan. 3, 2020    (CN) .......................... 202010008247.3

(51) Int. Cl.
H03K 19/0175    (2006.01)
H03K 19/173     (2006.01)
H03K 19/17736   (2020.01)

(52) U.S. Cl.
CPC . H03K 19/017509 (2013.01); H03K 19/1737 (2013.01); H03K 19/17744 (2013.01)

(58) Field of Classification Search
None
See application file for complete search history.

(56) References Cited

U.S. PATENT DOCUMENTS 8,242,996 B2    8/2012    Lee
8,493,255 B2    7/2013    Thirunakkarasu et al.
(Continued)

FOREIGN PATENT DOCUMENTS

CN    101078846 A    11/2007
CN    103404028 A    11/2013
(Continued)

OTHER PUBLICATIONS

Fourth Chinese Office Action dated, Jul. 5, 2022, for corresponding Chinese Application No. 202010008247.3.
(Continued)

*Primary Examiner* — Jany Richardson
(74) *Attorney, Agent, or Firm* — Kinney & Lange, P.A.

(57) ABSTRACT

A selection circuit, a method for controlling the selection circuit, and a multiplexing circuit are provided. The selection circuit includes N control circuits and M booster circuits. Control terminals of M control circuits among the N control circuits are coupled to output terminals of the M booster circuits, respectively, and first input terminals of the M booster circuits are coupled to receive M control signals among N control signals, respectively. Second input terminals of the M booster circuits are coupled to receive M boost (Continued)

signals respectively, and each booster circuit is configured to provide the received control signal to an output terminal of the booster circuit and increase a potential at the output terminal of the booster circuit by using the received boost signal.

11 Claims, 10 Drawing Sheets

(56) References Cited

U.S. PATENT DOCUMENTS

| | | | |
|---|---|---|---|
| 11,012,274 | B2 | 5/2021 | Yuan et al. |
| 11,145,268 | B2 | 10/2021 | Yamamoto |
| 2016/0293093 | A1 | 10/2016 | Seo et al. |
| 2019/0305071 | A1* | 10/2019 | Yamamoto ........... H10K 59/131 |
| 2021/0110781 | A1 | 4/2021 | Yamamoto |

FOREIGN PATENT DOCUMENTS

| | | |
|---|---|---|
| CN | 110503910 A | 11/2019 |
| CN | 111145677 A | 5/2020 |
| WO | 2018190245 A1 | 10/2018 |

OTHER PUBLICATIONS

First Chinese Office dated Jan. 28, 2021, received for corresponding Chinese Application No. 202010008247.3, 18 pages.
Second Chinese Office dated Jul. 19, 2021, received for corresponding Chinese Application No. 202010008247.3, 12 pages.

* cited by examiner

900

S910 — N control signals and M boost signals are provided to the selection circuit, and each booster circuit receives one of the control signals and one of the boost signals, and provides the received control signal to the control terminal of the control circuit coupled to the booster circuit, and increases a potential at the control terminal of the control circuit coupled to the booster circuit by using the received boost signal during a period when the received control signal is at an effective level

S920 — An input signal is provided to the selection circuit, and each control circuit provides a signal at the input terminal of the control circuit to the output terminal of the control circuit under a control of a signal at the control terminal of the control circuit

FIG. 9

SELECTION CIRCUIT AND METHOD FOR CONTROLLING THE SAME, AND MULTIPLEXING CIRCUIT

CROSS-REFERENCE TO RELATED APPLICATION(S)

The present disclosure is a Section 371 National Stage Application of International Application No. PCT/CN2020/140838, filed on Dec. 29, 2020, entitled "SELECTION CIRCUIT AND METHOD FOR CONTROLLING THE SAME, AND MULTIPLEXING CIRCUIT", which claims priority to Chinese Patent Application No. 202010008274.3, filed on Jan. 3, 2020, which are incorporated herein by reference in their entirety.

TECHNICAL FIELD

The present disclosure relates to a field of display technology, and in particular to a selection circuit, a method for controlling the selection circuit, and a multiplexing circuit.

BACKGROUND

With advancements in display technology, it is desirable to provide a selection circuit in a display device. Such a selection circuit can multiplex each data signal generated by a source driver IC into multiple data signals and provides these data signals to a display panel. In this way, the number of source driver ICs required can be reduced. However, the introduction of a selection circuit can cause an attenuation of the data signal, thereby affecting a display effect.

SUMMARY

The embodiments of the present disclosure provide a selection circuit, a method for controlling the selection circuit, and a multiplexing circuit.

According to an aspect of the present disclosure, a selection circuit is provided, and the selection circuit includes N control circuits, wherein each control circuit of the N control circuits is configured to provide a signal at an input terminal of the control circuit to an output terminal of the control circuit under control of a signal at a control terminal of the control circuit, and each of input terminals of the N control circuits is coupled to receive an input signal, and output terminals of the N control circuits are coupled to output N output signals respectively, wherein N is an integer greater than 1; and M booster circuits, wherein control terminals of M control circuits among the N control circuits are coupled to output terminals of the M booster circuits, respectively, and first input terminals of the M booster circuits are coupled to receive M control signals among N control signals, respectively, second input terminals of the M booster circuits are coupled to receive M boost signals respectively, and control terminals of other control circuits among the N control circuits except for the M control circuits are coupled to receive other control signals among the N control signals except for the M control signals, wherein each booster circuit of the M booster circuits is configured to provide a received control signal to an output terminal of the booster circuit, and increase a potential at the output terminal of the booster circuit by using a received boost signal, wherein M is an integer and 1≤M≤N.

For example, M=2, N=2, the N control circuits include a first control circuit and a second control circuit, and the M booster circuits include a first booster circuit and a second booster circuit, the N control signals include a first control signal and a second control signal, the M boost signals include a first boost signal and a second boost signal, and the N output signals include a first output signal and a second output signal, wherein a control terminal of the first control circuit is coupled to an output terminal of the first booster circuit, an input terminal of the first control circuit is coupled to receive the input signal, and an output terminal of the first control circuit is coupled to output the first output signal, a first input terminal of the first booster circuit is coupled to receive the first control signal, and a second input terminal of the first booster circuit is coupled to receive the first boost signal; and a control terminal of the second control circuit is coupled to an output terminal of the second booster circuit, an input terminal of the second control circuit is coupled to receive the input signal, and an output terminal of the second control circuit is coupled to output the second output signal, a first input terminal of the second booster circuit is coupled to receive the second control signal, and a second input terminal of the second booster circuit is coupled to receive the second boost signal.

For example, M=1, N=2, the N control circuits include a first control circuit and a second control circuit, and the M booster circuit includes a first booster circuit, the N control signals include a first control signal and a second control signal, the M boost signal includes a first boost signal, and the N output signals include a first output signal and a second output signal, wherein a control terminal of the first control circuit is coupled to an output terminal of the first booster circuit, an input terminal of the first control circuit is coupled to receive the input signal, and an output terminal of the first control circuit is coupled to output the first output signal, a first input terminal of the first booster circuit is coupled to receive the first control signal, and a second input terminal of the first booster circuit is coupled to receive the first boost signal; and a control terminal of the second control circuit is coupled to receive the second control signal, an input terminal of the second control circuit is coupled to receive the input signal, and an output terminal of the second control circuit is coupled to output the second output signal.

For example, M=1, N=2, the N control circuits include a first control circuit and a second control circuit, and the M booster circuit includes a second booster circuit, the N control signals include a first control signal and a second control signal, the M boost signal includes a second boost signal, and the N output signals include a first output signal and a second output signal, wherein a control terminal of the first control circuit is coupled to receive the first control signal, an input terminal of the first control circuit is coupled to receive the input signal, and an output terminal of the first control circuit is coupled to output the first output signal; and a control terminal of the second control circuit is coupled to an output terminal of the second booster circuit, an input terminal of the second control circuit is coupled to receive the input signal, and an output terminal of the second control circuit is coupled to output the second output signal, a first input terminal of the second booster circuit is coupled to receive the second control signal, and a second input terminal of the second booster circuit is coupled to receive the second boost signal.

For example, the first booster circuit includes: a first transistor, wherein a gate of the first transistor and a first electrode of the first transistor are coupled to receive the first control signal, and a second electrode of the first transistor is coupled to the control terminal of the first control circuit; a second transistor, wherein a gate of the second transistor is coupled to receive the second control signal, a first electrode of the second transistor is coupled to receive the first control signal, and a second electrode of the second transistor is coupled to the control terminal of the first control circuit; and a first capacitor, wherein a first terminal of the first capacitor is coupled to the control terminal of the first control circuit, and a second terminal of the first capacitor is coupled to receive the first boost signal.

For example, the second booster circuit includes: a third transistor, wherein a gate of the third transistor and a first electrode of the third transistor are coupled to receive the second control signal, and a second electrode of the third transistor is coupled to the control terminal of the second control circuit; a fourth transistor, wherein a gate of the fourth transistor is coupled to receive the first control signal, a first electrode of the fourth transistor is coupled to receive the second control signal, and a second electrode of the fourth transistor is coupled to the control terminal of the second control circuit; and a second capacitor, wherein a first terminal of the second capacitor is coupled to the control terminal of the second control circuit, and a second terminal of the second capacitor is coupled to receive the second boost signal.

For example, the first control circuit includes a fifth transistor, and a gate of the fifth transistor is used as the control terminal of the first control circuit, a first electrode of the fifth transistor is used as the input terminal of the first control circuit, and a second electrode of the fifth transistor is used as the output terminal of the first control circuit; and the second control circuit includes a sixth transistor, and a gate of the sixth transistor is used as the control terminal of the second control circuit, a first electrode of the sixth transistor is used as the input terminal of the second control circuit, and a second electrode of the sixth transistor is used as the output terminal of the second control circuit.

According to another aspect of the present disclosure, a multiplexing circuit is provided, and the multiplexing circuit includes the selection circuit described above.

For example, in each selection circuit, N=M=2.

For example, the at least one selection circuit includes a first selection circuit and a second selection circuit, and wherein in the first selection circuit and the second selection circuit, N=2 and M=1, the first selection circuit has a first booster circuit, the second selection circuit has a second booster circuit, a first control circuit in the first selection circuit and a first control circuit in the second selection circuit share the first booster circuit, and a second control circuit in the first selection circuit and a second control circuit in the second selection circuit share the second booster circuit.

According to yet another aspect of the present disclosure, a method for controlling the selection circuit described above is provided, and the method includes providing N control signals and M boost signals to the selection circuit, wherein each booster circuit receives one of the N control signals and one of the M boost signals, and provides a received control signal to the control terminal of the control circuit coupled to the booster circuit, and increases a potential at the control terminal of the control circuit coupled to the booster circuit by using a received boost signal during a period when the received control signal is at an effective level; and providing an input signal to the selection circuit, wherein each control circuit provides a signal at the input terminal of the control circuit to the output terminal of the control circuit under control of a signal at the control terminal of the control circuit.

BRIEF DESCRIPTION OF THE DRAWINGS

FIG. 9 shows a flowchart of a method for controlling a selection circuit according to the embodiments of the present disclosure.

DETAILED DESCRIPTION OF EMBODIMENTS

Figure 1:
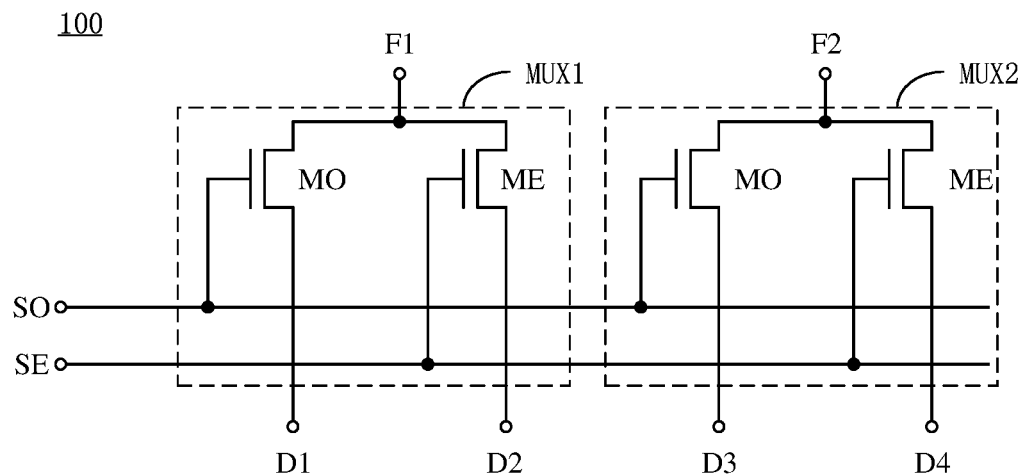
FIG. 1 shows a circuit diagram of a selection circuit.

In order to make the objectives, technical solutions, and advantages of the embodiments of the present disclosure clearer, the technical solutions in the embodiments of the present disclosure will be described clearly and completely in conjunction with the accompanying drawings in the embodiments of the present disclosure. The embodiments described in detail constitute only some of the embodiments contemplated in view of the present disclosure, but not all of them. Based on the described embodiments of the present disclosure, all other embodiments obtained by those ordinary skilled in the art without creative labor are within the protection scope of the present disclosure. It should be noted that throughout the accompanying drawings, the same elements are denoted by the same or similar reference signs. In the following description, some specific embodiments are only used for descriptive purposes, and should not be construed as having any limitation on the present disclosure, but are merely examples of the embodiments of the present disclosure. When it may cause confusion in the understanding of the present disclosure, conventional structures or configurations may be omitted. It should be noted that the shape and dimension of each component in the figure do not reflect the actual size and ratio, but merely illustrate the content of the embodiments of the present disclosure.

Unless otherwise defined, the technical or scientific terms used in the embodiments of the present disclosure should have the usual meanings understood by those skilled in the art. The "first", "second" and similar words used in the embodiments of the present disclosure do not denote any order, quantity, or importance, but are only used to distinguish different components.

In addition, in the description of the embodiments of the present disclosure, the term "connected" or "connected to" may mean that two components are directly connected, or that two components are connected via one or more other components. In addition, these two components may be connected or coupled by wired or wireless means.

The transistors used in the embodiments of the present disclosure may all be thin film transistors or field effect transistors or other devices with same characteristics. For example, a thin film transistor used in the embodiments of the present disclosure may be an oxide semiconductor transistor. Since a source and a drain of a switching thin film transistor used here are symmetrical, the source and the drain may be interchanged. In the embodiments of the present disclosure, one of the source and the drain is referred to as a first electrode, and another of the source and the drain is referred to as a second electrode. In the following example, an N-type thin film transistor is taken as an example for description. The embodiments of the present disclosure may be applied to a case of a P-type thin film transistor.

In the embodiments of the present disclosure, the so-called booster circuit increasing a potential at a control terminal refers to increasing an amplitude of an effective level at the control terminal. For example, for an N-type transistor with a high level as the effective level, the so-called booster circuit increasing the potential at the control terminal of the transistor refers to increasing an amplitude of a high level at the control terminal, for example, changing a potential of +20V to +40V. For a P-type transistor with a low level as the effective level, the so-called booster circuit increasing the potential at the control terminal of the transistor refers to increasing an amplitude of a low level at the control terminal, for example, changing a potential of −20V to −40V.

FIG. 1 shows a circuit diagram of a multiplexing circuit. As shown in FIG. 1, in a multiplexing circuit 100, each of a multiplexing unit MUX1 and a multiplexing unit MUX2 includes a transistor MO and a transistor ME, and a gate of the transistor MO is coupled to receive a control signal SO, and a gate of the transistor ME is coupled to receive a control signal SE. In a case that the control signal SO is at a high level, the two transistors MO are turned on, thereby providing an input signal F1 to a data line D1 and an input signal F2 to a data line D3. In a case that the control signal SE is at a high level, the two transistors ME are turned on, thereby providing the input signal F1 to a data line D2 and the input signal F2 to a data line D4.

In the example of FIG. 1, since a gate voltage of the transistor MO is always equal to a level of the control signal SO, and a gate voltage of the transistor ME is always equal to a level of the control signal SE, a following case may exist: each of the level of the control signal SO and the level of the control signal SE is not high enough to fully turn on the transistor MO and the transistor ME. In this case, a current passing through the transistor MO and the transistor ME is small, such that an output terminal of the transistor MO has a significant signal attenuation relative to an input terminal of the transistor MO, and an output terminal of the transistor ME has a significant signal attenuation relative to an input terminal of the transistor ME. Therefore, signals on the data lines D1 to D4 have a significant attenuation relative to the input signals F1 and F2, thereby affecting the display.

Figure 2:
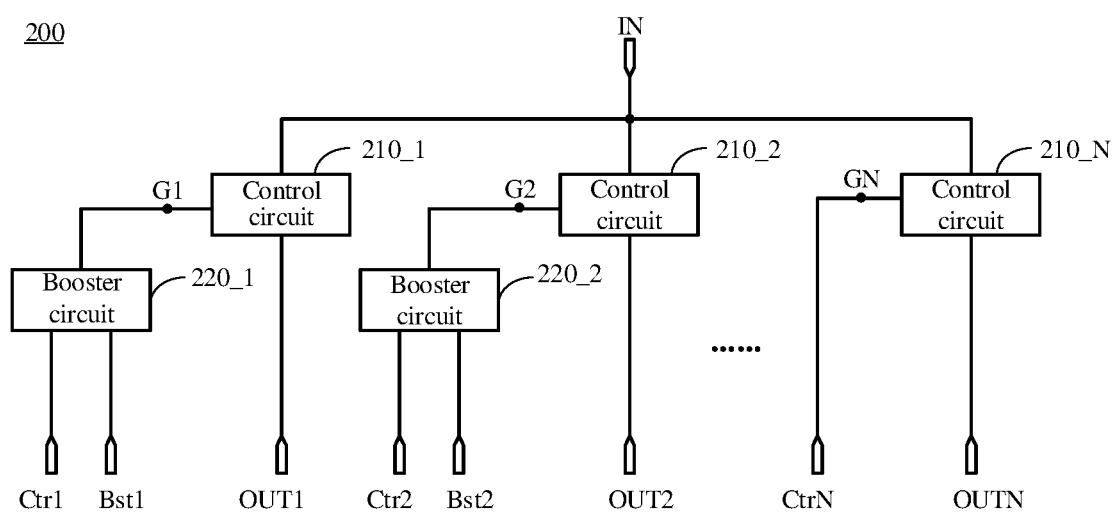
FIG. 2 shows a block diagram of a selection circuit according to the embodiments of the present disclosure.

FIG. 2 shows a block diagram of a selection circuit according to the embodiments of the present disclosure. As shown in FIG. 2, the selection circuit 200 includes N control circuits 210_1, 210_2, . . . , 210_N and M booster circuits 220_1, 220_2, . . . , 220_M, where N is an integer greater than 1, and M is an integer and 1≤M≤N.

Each of the control circuits 210_1, 210_2, . . . , 210_N has a control terminal, an input terminal, and an output terminal. As shown in FIG. 2, the input terminal of each of the control circuits 210_1, 210_2, . . . , 210_N is coupled to receive an input signal IN. Control terminals of the N control circuits are coupled to receive N control signals, respectively. For example, a control terminal G1 of the control circuit 210_1 is coupled to receive a control signal Ctr1 (via a booster circuit 220_1 in FIG. 2), and a control terminal G2 of the control circuit 210_2 is coupled to receive a control signal Ctr2 (via a booster circuit 220_2 in FIG. 2), and so on, a control terminal GN of the control circuit 210_N is coupled to receive a control signal CtrN. Output terminals of the N control circuits are coupled to output N output signals, respectively. For example, an output terminal of the control circuit 210_1 is coupled to output an output signal OUT1, an output terminal of the control circuit 210_2 is coupled to output an output signal OUT2, and so on.

Each control circuit may provide a signal at its input terminal to its output terminal under a control of a signal at its control terminal. For example, the control circuit 210_1 may provide a signal at its input terminal (i.e., the input signal IN) to its output terminal under a control of a signal at the control terminal G1, so as to generate the output signal OUT1, and the control circuit 210_2 may provide a signal at its input terminal (i.e., the input signal IN) to its output terminal under a control of a signal at the control terminal G2, so as to generate the output signal OUT2, and so on.

Control terminals of M control circuits among the N control circuits 210_1, 210_2, . . . , 210_N are coupled to output terminals of the M booster circuits 220_1, 220_2, . . . , 220_M, respectively. First input terminals of the M booster circuits 220_1, 220_2, . . . , 220_M are coupled to receive M control signals among the N control signals, respectively, and second input terminals of the M booster circuits 220_1, 220_2, . . . , 220_M are coupled to receive M boost signals, respectively. For example, the control terminal G1 of the control circuit 210_1 is coupled to an output terminal of the booster circuit 220_1, a first input terminal of the booster circuit 220_1 is coupled to receive the control signal Ctr1, and a second input terminal of the booster circuit 220_1 is coupled to receive a boost signal Bst1. The control terminal G2 of the control circuit 210_2 is coupled to an output terminal of the booster circuit 220_2, a first input terminal of the booster circuit 220_2 is coupled to receive the control signal Ctr2, and a second input terminal of the booster circuit 220_2 is coupled to receive a boost signal Bst2, and so on. Although in the example of FIG. 2, the first M control circuits among the N control circuits 210_1, 210_2, . . . , 210_N are set to be coupled to the booster circuits, the embodiments of the present disclosure are not limited to this, the last M control circuits among the N control circuits may be selected to be coupled to the booster circuits, and M control circuits that are arbitrarily selected may also be coupled to the booster circuits as desired.

Each booster circuit may provide a received control signal to a control terminal of a control circuit coupled to the booster circuit, and increase a potential at the control terminal of the control circuit coupled to the booster circuit by using a received boost signal. For example, the booster circuit 220_1 may provide the control signal Ctr1 to the control terminal G1 of the control circuit 210_1, and increase a potential at the control terminal G1 by using the boost signal Bst1. The booster circuit 220_2 may provide the control signal Ctr2 to the control terminal G2 of the control circuit 210_2, and increase a potential at the G2 control terminal by using the boost signal Rst2, and so on.

The embodiments of the present disclosure provide the booster circuit for the control circuit in the selection circuit, which may provide a potential of the control signal to the control terminal of the control circuit, and on this basis, further increase a potential at the control terminal of the control circuit, thereby increasing a current passing through the control circuit and reducing the signal attenuation of the output terminal of the control circuit relative to the input terminal of the control circuit.

Figure 3:
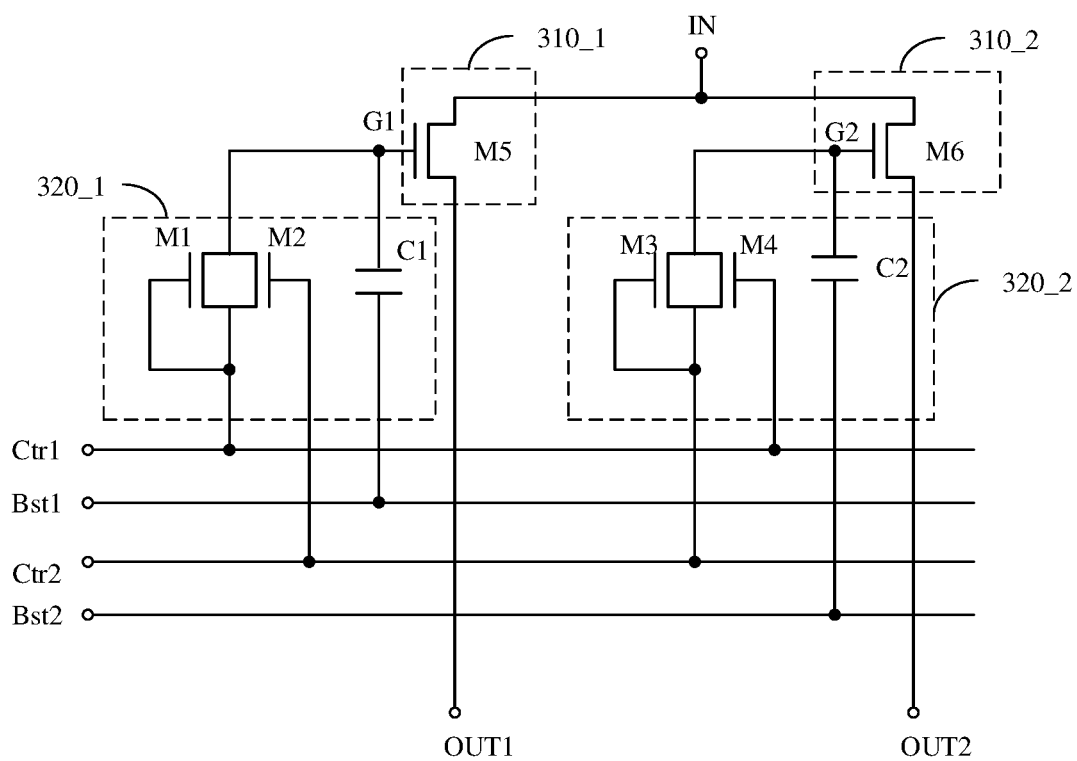
FIG. 3 shows a circuit diagram of a selection circuit according to the embodiments of the present disclosure.

FIG. 3 shows a circuit diagram of a selection circuit according to the embodiments of the present disclosure. FIG. 3 illustrates a structure of a selection circuit with N=M=2 as an example. The above description of the selection circuit 200 with reference to FIG. 2 is also applicable to the selection circuit 300.

As shown in FIG. 3, the selection circuit 300 includes a first control circuit 310_1, a second control circuit 310_2, a first booster circuit 320_1, and a second booster circuit 320_2.

A control terminal G1 of the first control circuit 310_1 is coupled to an output terminal of the first booster circuit 320_1. An input terminal of the first control circuit 310_1 is coupled to receive the input signal IN. An output terminal of the first control circuit 310_1 is coupled to output the first output signal OUT1. A first input terminal of the first booster circuit 320_1 is coupled to receive the first control signal Ctr1, and a second input terminal of the first booster circuit 320_1 is coupled to receive the first boost signal Bst1.

A control terminal G2 of the second control circuit 310_2 is coupled to an output terminal of the second booster circuit 320_2. An input terminal of the second control circuit 310_2 is coupled to receive the input signal IN. An output terminal of the second control circuit 320_2 is coupled to output the second output signal OUT2. A first input terminal of the second booster circuit 320_2 is coupled to receive the second control signal Ctr2, and a second input terminal of the second booster circuit 320_2 is coupled to receive the second boost signal Bst2.

In some embodiments, as shown in FIG. 3, the first booster circuit 320_1 may include a first transistor M1, a second transistor M2, and a first capacitor C1. A gate of the first transistor M1 and a first electrode of the first transistor M1 are coupled to receive the first control signal Ctr1, and a second electrode of the first transistor M1 is coupled to the control terminal G1 of the first control circuit 310_1. A gate of the second transistor M2 is coupled to receive the second control signal Ctr2, a first electrode of the second transistor M2 is coupled to receive the first control signal Ctr1, and a second electrode of the second transistor M2 is coupled to the control terminal G1 of the first control circuit 310_1. A first terminal of the first capacitor C1 is coupled to the control terminal G1 of the first control circuit 310_1, and a second terminal of the first capacitor C1 is coupled to receive the first boost signal Bst1.

In some embodiments, as shown in FIG. 3, the second booster circuit 320_2 may include a third transistor M3, a fourth transistor M4, and a second capacitor C2. A gate of the third transistor M3 and a first electrode of the third transistor M3 are coupled to receive the second control signal Ctr2, and a second electrode of the third transistor M3 is coupled to the control terminal G2 of the second control circuit 310_2. A gate of the fourth transistor M4 is coupled to receive the first control signal Ctr1, a first electrode of the fourth transistor M4 is coupled to receive the second control signal Ctr2, and a second electrode of the fourth transistor M4 is coupled to the control terminal G2 of the second control circuit 310_2. A first terminal of the second capacitor C2 is coupled to the control terminal G2 of the second control circuit 310_2, and a second terminal of the second capacitor C2 is coupled to receive the second boost signal Bst2.

In some embodiments, as shown in FIG. 3, the first control circuit 310_1 includes a fifth transistor M5, and the second control circuit 310_2 includes a sixth transistor M6. A gate of the fifth transistor M5 is used as the control terminal G1 of the first control circuit 310_1. A first electrode of the fifth transistor M5 is coupled as the input terminal of the first control circuit 310_1 to receive the input signal IN. A second electrode of the fifth transistor M5 is coupled as the output terminal of the first control circuit 310_1 to output the first output signal OUT1. Similarly, a gate of the sixth transistor M6 is used as the control terminal G2 of the second control circuit 310_2. A first electrode of the sixth transistor M6 is coupled as the input terminal of the second control circuit 310_2 to receive the input signal IN. A second electrode of the sixth transistor M6 is coupled as the output terminal of the second control circuit 310_2 to output the second output signal OUT2.

Although M=N=2 is used as an example for description above, the embodiments of the present disclosure are not limited to this. The values of M and N may be set as desired, for example, M=N=3. In this case, each selection circuit includes three control circuits and three booster circuits respectively coupled to the three control circuits. Accordingly, three control signals and three boost signals are provided and coupled to the three control circuits and three booster circuits respectively, in a similar manner to the above description, which will not be repeated here.

Figure 4:
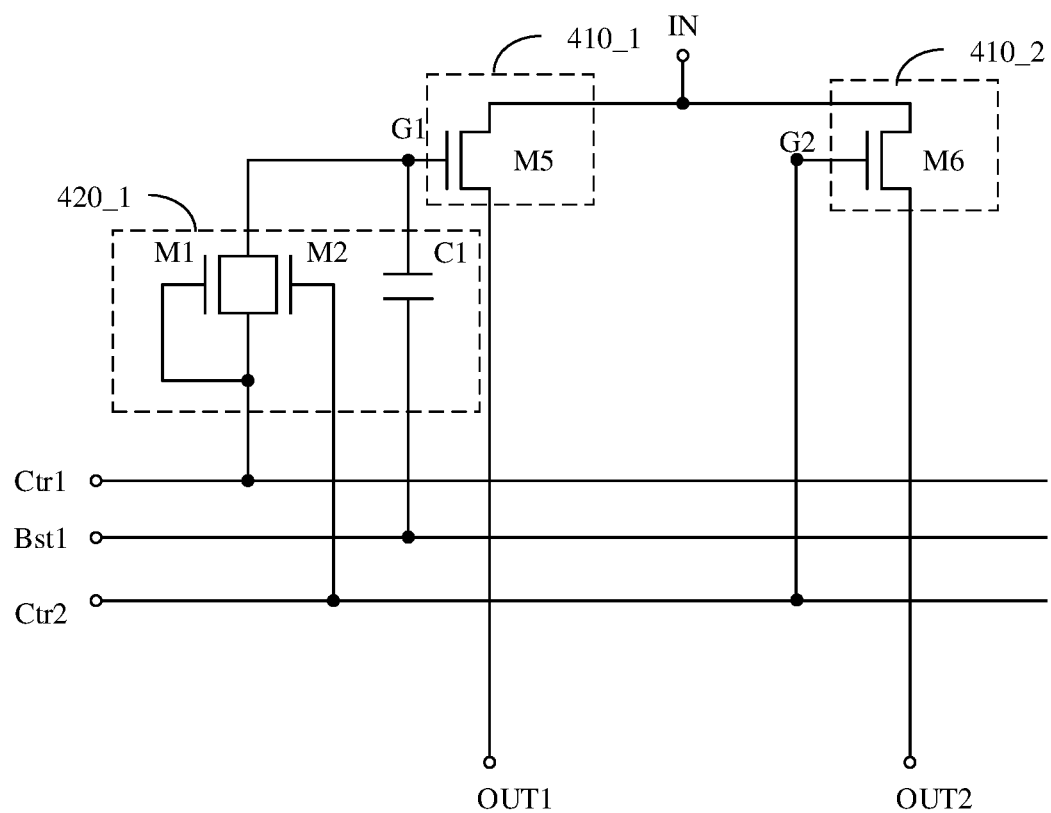
FIG. 4 shows a circuit diagram of a selection circuit according to the embodiments of the present disclosure.

FIG. 4 shows a circuit diagram of a selection circuit according to the embodiments of the present disclosure.

As shown in FIG. 4, the selection circuit 400 includes a first control circuit 410_1, a second control circuit 410_2, and a first booster circuit 420_1.

A control terminal G1 of the first control circuit 410_1 is coupled to an output terminal of the first booster circuit 420_1. An input terminal of the first control circuit 410_1 is coupled to receive the input signal IN. An output terminal of the first control circuit 410_1 is coupled to output the first output signal OUT1. A first input terminal of the first booster circuit 420_1 is coupled to receive the first control signal Ctr1, and a second input terminal of the first booster circuit 420_1 is coupled to receive the first boost signal Bst1.

A control terminal G2 of the second control circuit 410_2 is coupled to receive the second control signal Ctr2. An input terminal of the second control circuit 410_2 is coupled to receive the input signal IN. An output terminal of the second control circuit 410_2 is coupled to output the second output signal OUT2.

As shown in FIG. 4, the first control circuit 410_1, the second control circuit 410_2, and the first booster circuit 420_1 may have similar structures to that of the first control circuit 310_1, the second control circuit 310_2, and the first booster circuit 320_1 described above, respectively. For example, the first control circuit 410_1 includes a fifth transistor M5, the second control circuit 410_2 includes a sixth transistor M6, and the first booster circuit 420_1 includes a first transistor M1, a second transistor M2, and a first capacitor C1, which will not be repeated here.

Figure 5:
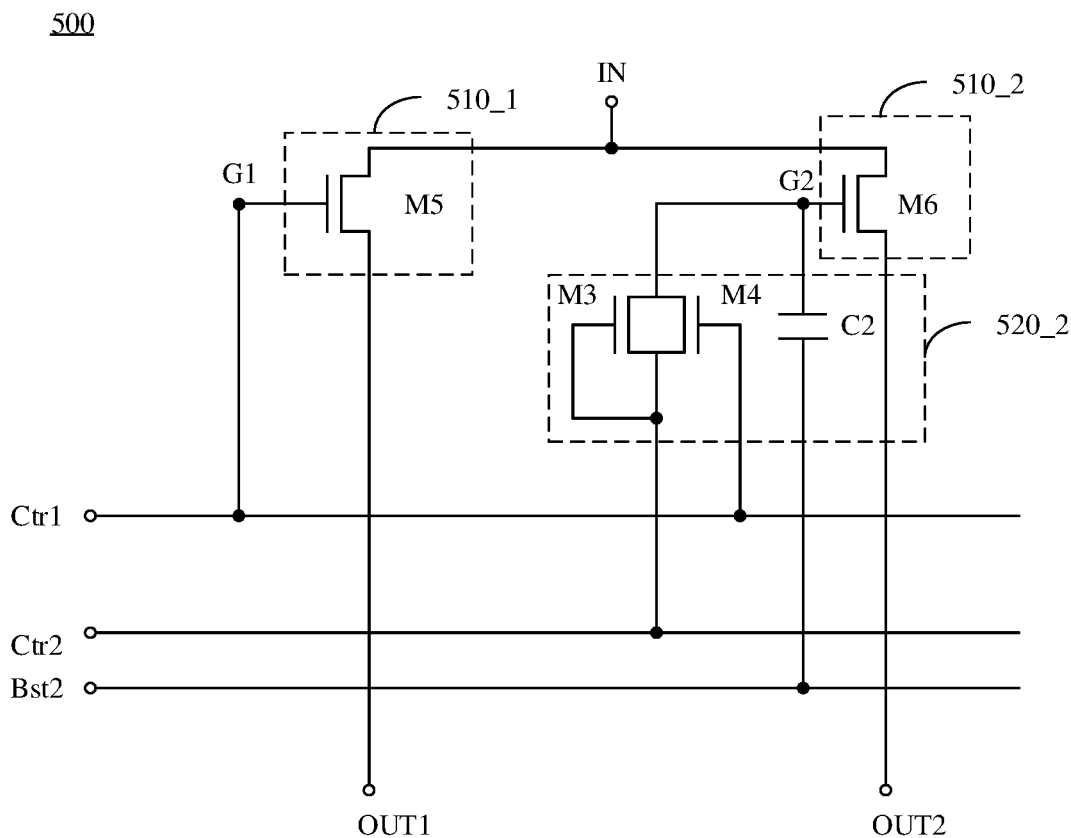
FIG. 5 shows a circuit diagram of a selection circuit according to the embodiments of the present disclosure.

FIG. 5 shows a circuit diagram of a selection circuit according to the embodiments of the present disclosure.

As shown in FIG. 5, the selection circuit 500 includes a first control circuit 510_1, a second control circuit 510_2, and a second booster circuit 520_2.

A control terminal G1 of the first control circuit 510_1 is coupled to receive the first control signal Ctr1. An input terminal of the first control circuit 510_1 is coupled to receive the input signal IN. An output terminal of the first control circuit 510_1 is coupled to output the first output signal OUT1.

A control terminal G2 of the second control circuit 510_2 is coupled to an output terminal of the second booster circuit 520_2. An input terminal of the second control circuit 510_2 is coupled to receive the input signal IN. An output terminal of the second control circuit 510_2 is coupled to output the second output signal OUT2. A first input terminal of the second booster circuit 520_2 is coupled to receive the second control signal Ctr2, and a second input terminal of the second booster circuit 520_2 is coupled to receive the second boost signal Bst2.

As shown in FIG. 5, the first control circuit 510_1, the second control circuit 510_2, and the second booster circuit 520_2 may have similar structures to that of the first control circuit 310_1, the second control circuit 310_2, and the second booster circuit 320_2 described above, respectively. For example, the first control circuit 510_1 includes a fifth transistor M5, the second control circuit 510_2 includes a sixth transistor M6, and the second booster circuit 520_2 includes a third transistor M3, a fourth transistor M4, and a second capacitor C2, which will not be repeated here.

Figure 6:
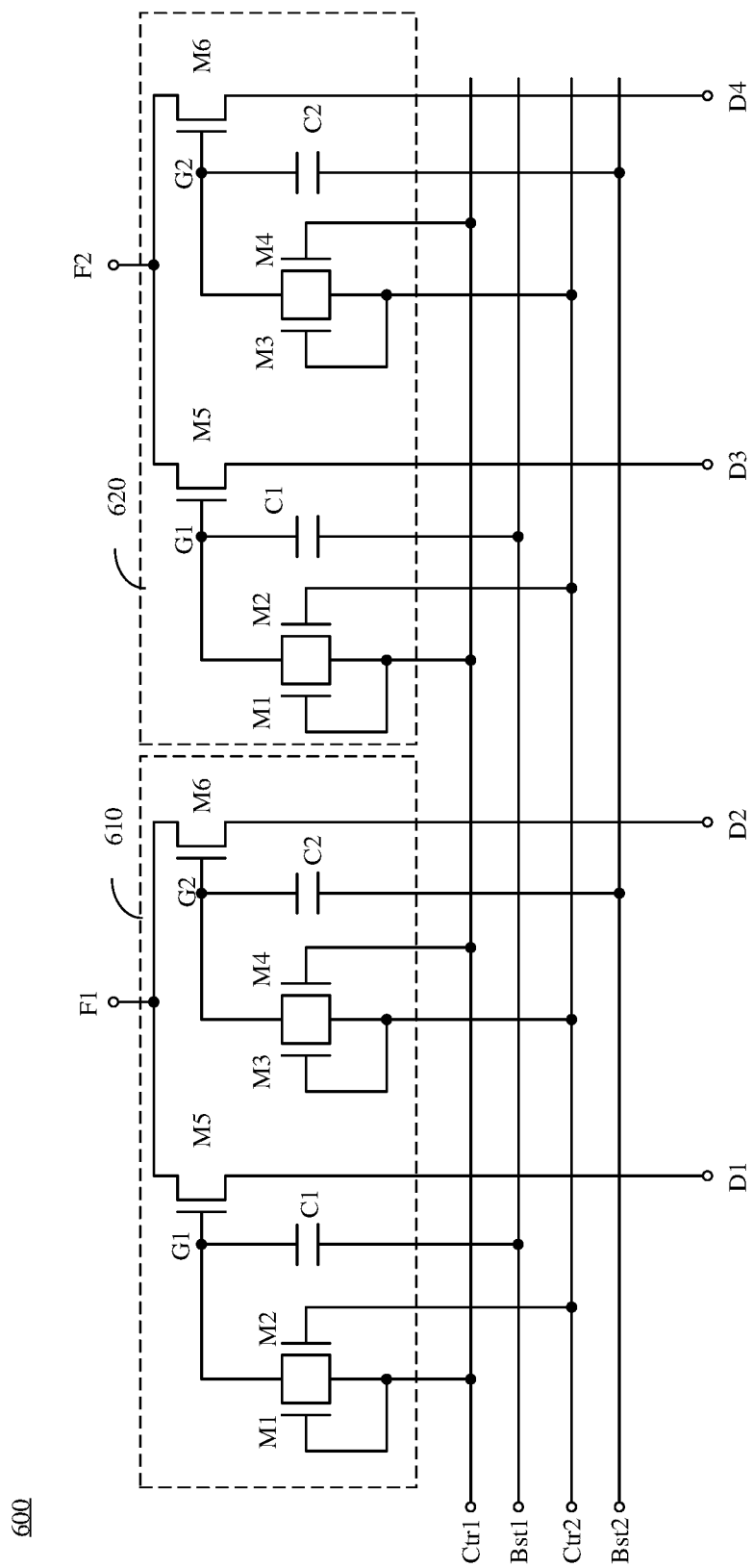
FIG. 6 shows a circuit diagram of a multiplexing circuit according to the embodiments of the present disclosure.

FIG. 6 shows a circuit diagram of a multiplexing circuit according to the embodiments of the present disclosure. The multiplexing circuit 600 may include the selection circuit of any of the above-mentioned embodiments.

As shown in FIG. 6, the multiplexing circuit 600 includes a first selection circuit 610 and a second selection circuit 620. In the example of FIG. 6, each of the first selection circuit 610 and the second selection circuit 620 may be implemented by the selection circuit 300 described above.

An input signal of the first selection circuit 610 may be the first input signal F1. A first output signal of the first selection circuit 610 may be provided to the first data line D1, so as to provide a first data signal to the first data line D1. A second output signal of the first selection circuit 610 may be provided to the second data line D2, so as to provide a second data signal to the second data line D2.

An input signal of the second selection circuit 620 may be the second input signal F2. A first output signal of the second selection circuit 620 may be provided to the third data line D3, so as to provide a third data signal to the third data line D3. A second output signal of the second selection circuit 620 may be provided to the fourth data line D4, so as to provide a fourth data signal to the fourth data line D4.

First control signal terminals of the first selection circuit 610 and the second selection circuit 620 are used to receive the first control signal Ctr1. Second control signal terminals of the first selection circuit 610 and the second selection circuit 620 are used to receive the second control signal Ctr2. First boost signal terminals of the first selection circuit 610 and the second selection circuit 620 are used to receive the first boost signal Bst1. Second boost signal terminals of the first selection circuit 610 and the second selection circuit 620 are used to receive the second boost signal Bst2.

Figure 7:
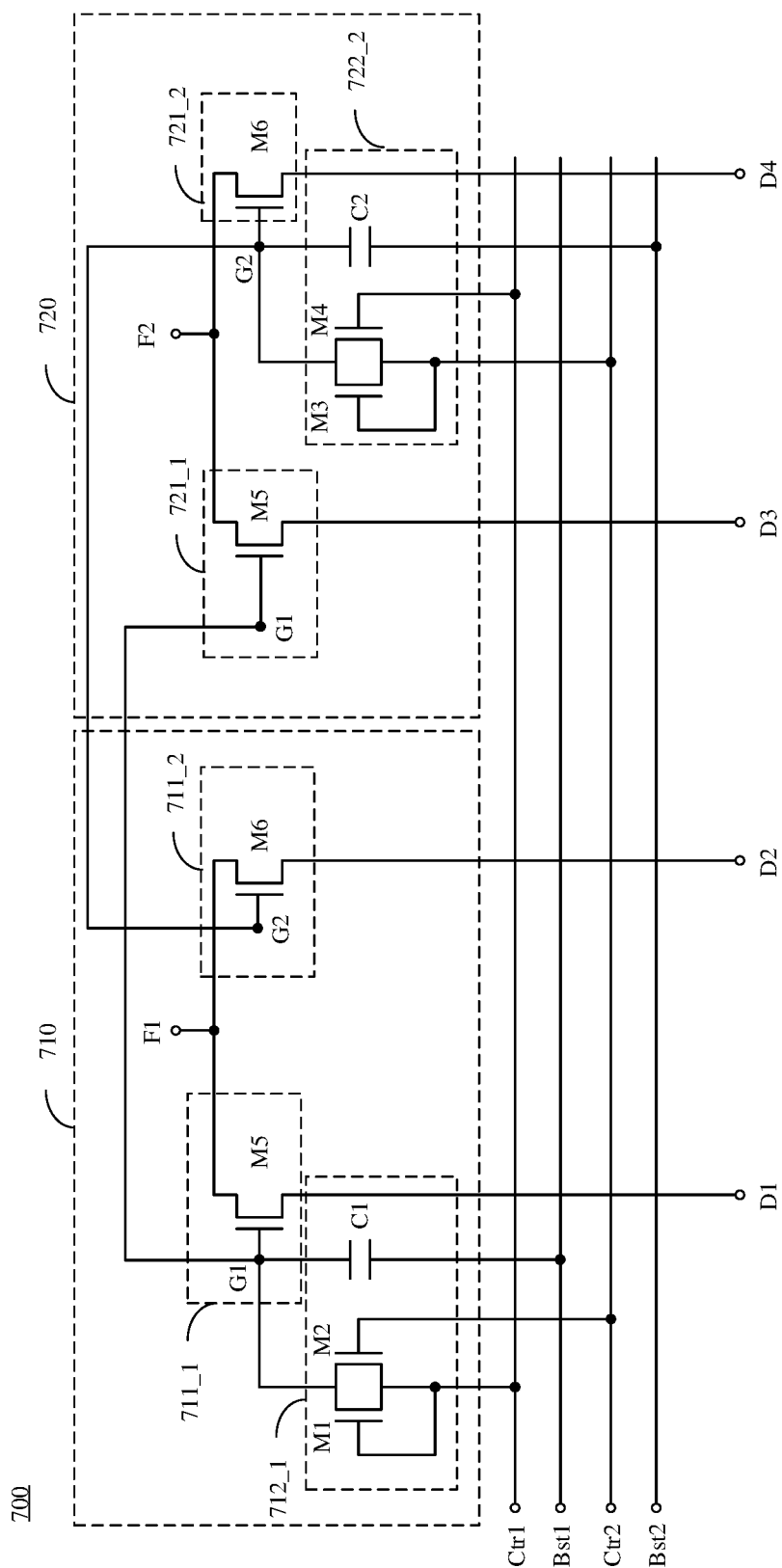
FIG. 7 shows a circuit diagram of a multiplexing circuit according to the embodiments of the present disclosure.

FIG. 7 shows a circuit diagram of a multiplexing circuit according to the embodiments of the present disclosure. The multiplexing circuit 700 may include the selection circuit of any of the above-mentioned embodiments. For example, N in at least two of the selection circuits may be greater than M, and a booster circuit may be shared between the at least two selection circuits.

As shown in FIG. 7, the multiplexing circuit 700 includes a first selection circuit 710 and a second selection circuit 720. In the example of FIG. 7, the first selection circuit 710 is implemented by the selection circuit 400 described above, and the second selection circuit 720 is implemented by the selection circuit 500 described above.

In FIG. 7, the first selection circuit 710 includes a first control circuit 711_1, a second control circuit 711_2, and a first booster circuit 712_1. A control terminal G1 of the first control circuit 711_1 is coupled to an output terminal of the first booster circuit 712_1. An input terminal of the first control circuit 711_1 is coupled to receive the first input signal F1. An output terminal of the first control circuit 711_1 is coupled to output the first output signal. A first input terminal of the first booster circuit 712_1 is coupled to receive the first control signal Ctr1, and a second input terminal of the first booster circuit 712_1 is coupled to receive the first boost signal Bst1. A control terminal G2 of the second control circuit 711_2 is coupled to receive the second control signal Ctr2. An input terminal of the second control circuit 711_2 is coupled to receive the first input signal F1. An output terminal of the second control circuit 711_2 is coupled to output the second output signal. The first output signal and the second output signal generated by the first selection circuit 710 based on the first input signal F1 are provided to the first data line D1 and the second data line D2, respectively.

The second selection circuit 720 includes a first control circuit 721_1, a second control circuit 721_2, and a second booster circuit 722_2. A control terminal G1 of the first control circuit 721_1 is coupled to receive the first control signal Ctr1. An input terminal of the first control circuit 721_1 is coupled to receive the second input signal F2. An output terminal of the first control circuit 721_1 is coupled to output the first output signal. A control terminal G2 of the second control circuit 721_2 is coupled to an output terminal of the second booster circuit 722_2. An input terminal of the second control circuit 721_2 is coupled to receive the second input signal F2. An output terminal of the second control circuit 721_2 is coupled to output the second output signal. A first input terminal of the second booster circuit 722_2 is coupled to receive the second control signal Ctr2, and a second input terminal of the second booster circuit 722_2 is coupled to receive the second boost signal Bst2. The first output signal and the second output signal generated by the second selection circuit 720 based on the second input signal F2 are provided to the third data line D3 and the fourth data line D4, respectively.

In the first selection circuit 710, the first control circuit 711_1 may include a fifth transistor M5, the second control circuit 711_2 may include a sixth transistor M6, and the first booster circuit 712_1 may include a first transistor M1, a second transistor M2, and a first capacitor C1. A gate of the first transistor M1 and a first electrode of the first transistor M1 are coupled to receive the first control signal Ctr1, and a second electrode of the first transistor M1 is coupled to the control terminal G1 of the first control circuit 711_1. A gate of the second transistor M2 is coupled to receive the second control signal Ctr2, a first electrode of the second transistor M2 is coupled to receive the first control signal Ctr1, and a second electrode of the second transistor M2 is coupled to the control terminal G1 of the first control circuit 711_1. A first terminal of the first capacitor C1 is coupled to the control terminal G1 of the first control circuit 711_1, and a second terminal of the first capacitor C1 is coupled to receive the first boost signal Bst1. A gate of the fifth transistor M5 is used as the control terminal G1 of the first control circuit 711_1, a first electrode of the fifth transistor M5 is coupled as the input terminal of the first control circuit 711_1 to receive the first input signal F1, and a second electrode of the fifth transistor M5 is coupled as the output terminal of the first control circuit 711_1 to output the first output signal to the first data line D1. Similarly, a gate of the sixth transistor M6 is used as the control terminal G2 of the second control circuit 711_2, a first electrode of the sixth transistor M6 is coupled as the input terminal of the second control circuit 711_2 to receive the first input signal F1, and a second electrode of the sixth transistor M6 is coupled as the output terminal of the second control circuit 711_2 to output the second output signal to the second data line D2.

In the second selection circuit 720, the first control circuit 721_1 includes a fifth transistor M5, the second control circuit 721_2 includes a sixth transistor M6, and the second booster circuit 722_2 includes a third transistor M3, a fourth transistor M4, and a second capacitor C2. A gate of the third transistor M3 and a first electrode of the third transistor M3 are coupled to receive the second control signal Ctr2, and a second electrode of the third transistor M3 is coupled to the control terminal G2 of the second control circuit 721_2. A gate of the fourth transistor M4 is coupled to receive the first control signal Ctr1, a first electrode of the fourth transistor M4 is coupled to receive the second control signal Ctr2, and a second electrode of the fourth transistor M4 is coupled to the control terminal G2 of the second control circuit 721_2. A first terminal of the second capacitor C2 is coupled to the control terminal G2 of the second control circuit 721_2, and a second terminal of the second capacitor C2 is coupled to receive the second boost signal Bst2. A gate of the fifth transistor M5 is used as the control terminal G1 of the first control circuit 721_1, a first electrode of the fifth transistor M5 is coupled as the input terminal of the first control circuit 721_1 to receive the second input signal F2, and a second electrode of the fifth transistor M5 is coupled as the output terminal of the first control circuit 721_1 to output the first output signal to the third data line D3. Similarly, a gate of the sixth transistor M6 is used as the control terminal G2 of the second control circuit 721_2, a first electrode of the sixth transistor M6 is coupled as the input terminal of the second control circuit 721_2 to receive the second input signal F2, and a second electrode of the sixth transistor M6 is coupled as the output terminal of the second control circuit 721_2 to output the second output signal to the fourth data line D4.

As shown in FIG. 7, the control terminal G1 of the first control circuit 711_1 in the first selection circuit 710 and the control terminal G1 of the first control circuit 721_1 in the second selection circuit 720 are both coupled to the output terminal of the first booster circuit 721_1. Therefore, the first control circuit 711_1 in the first selection circuit 710 and the first control circuit 721_1 in the second selection circuit 720 may share the first booster circuit 721_1, so as to increase potentials at respective control terminals G1.

The control terminal G2 of the second control circuit 711_2 in the first selection circuit 710 and the control terminal G2 of the second control circuit 721_2 in the second selection circuit 720 are both coupled to the output terminal of the second booster circuit 722_2, so that the second control circuit 711_2 in the first selection circuit 710 and the second control circuit 721_2 in the second selection circuit 720 may share the second booster circuit 722_2, so as to increase potentials at the respective control terminals G2.

In some embodiments, as shown in FIG. 7, the gate of the fifth transistor M5 in the first selection circuit 710 and the gate of the fifth transistor M5 in the second selection circuit 720 are both coupled to the first booster circuit 712_1. The gate of the sixth transistor M6 in the first selection circuit 710 and the gate of the sixth transistor M6 in the second selection circuit 720 are both coupled to the output terminal of the second booster circuit 722_2.

By sharing the booster circuit between at least two selection circuits, the complexity of circuit wiring may be reduced and space may be saved. In some embodiments, the two selection circuits sharing the booster circuit may be adjacent selection circuits, so as to further simplify the wiring.

Although examples of multiplexing circuits are described above with reference to FIGS. 6 and 7, the embodiments of the present disclosure are not limited to this, and a number of selection circuits, structures of the selection circuits, and a manner the selection circuits sharing the booster circuit may be selected in the multiplexing circuit as desired. For example, the multiplexing circuit may include one, three or more selection circuits, and each multiplexing circuit may include three or more control circuits, and one or more of the control circuits are provided with the booster circuit as required. For example, in a case that each multiplexing circuit includes three control circuits, the first selection circuit may have a first booster circuit, the second selection circuit may have a second booster circuit, and the third selection circuit may have a third booster circuit. The first control circuits of the three selection circuits share the first booster circuit, the three second control circuits of the three selection circuits share the second booster circuit, and the three third control circuits of the three selection circuits share the third booster circuit. In some embodiments, in a case that the booster circuit is shared among multiple selection circuits, the booster circuit may be divided into different selection circuits as desired. For example, the second booster circuit in FIG. 7 may be regarded as a part of the first selection circuit 710, which is equivalent to the multiplexing circuit 700 including a selection circuit with two booster circuits and a selection circuit without any booster circuit. The selection circuit without any booster circuit shares the two booster circuits of the selection circuit with two booster circuits.

Figure 8:
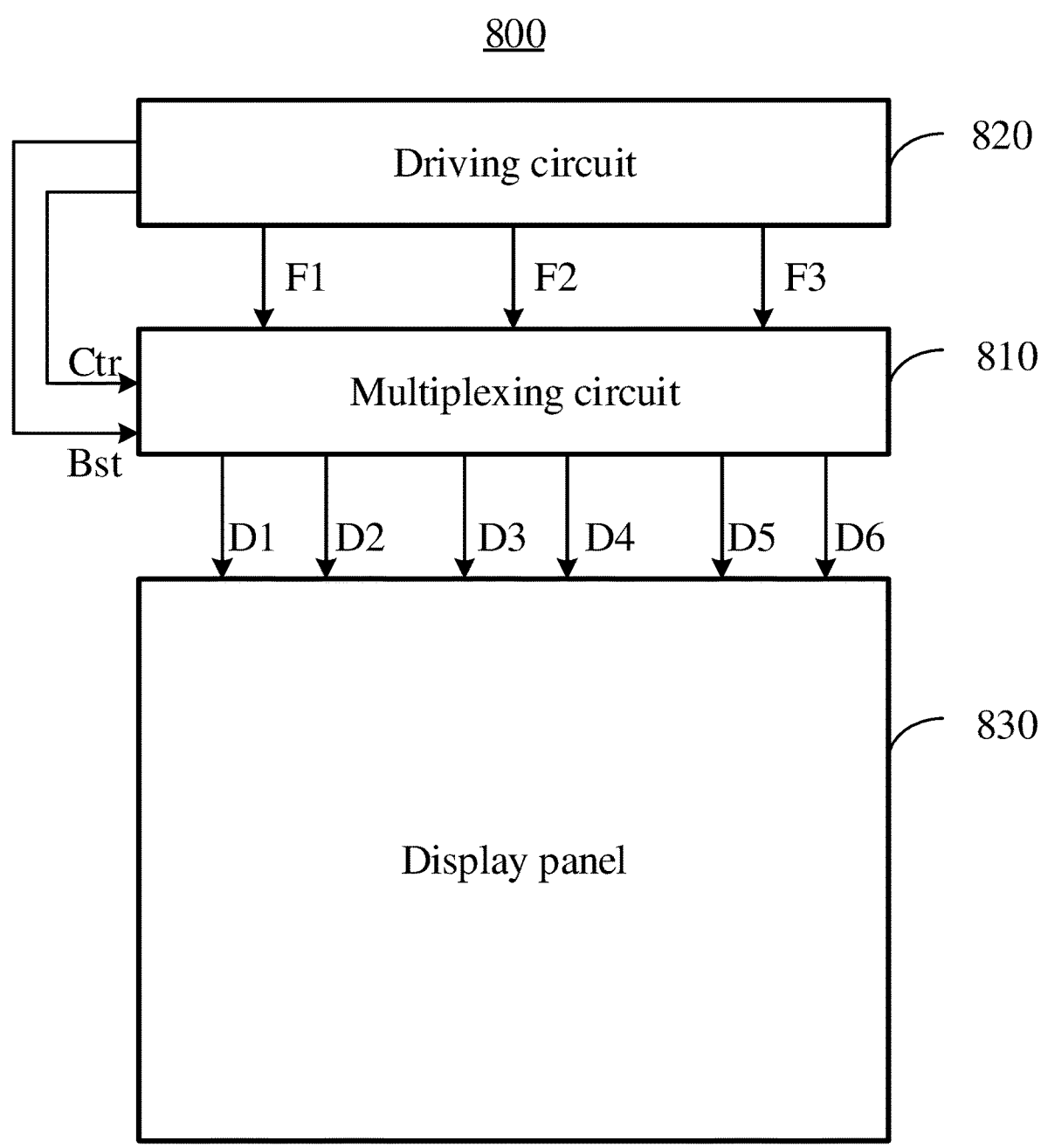
FIG. 8 shows a block diagram of a display device according to the embodiments of the present disclosure.

FIG. 8 shows a block diagram of a display device according to the embodiments of the present disclosure. The display device may include the multiplexing circuit of any of the above-mentioned embodiments.

As shown in FIG. 8, the display device 800 includes at least one multiplexing circuit 810, and the multiplexing circuit 810 may be implemented by the multiplexing circuit of any of the embodiments described above, such as the multiplexing circuit 600 or 700.

The display device 800 may further include a driving circuit 820 coupled to the multiplexing circuit 810. The driving circuit 820 may provide a control signal, a boost signal, and an input signal to each selection circuit in the multiplexing circuit 810. For example, input signals F1, F2, F3, . . . are provided to input signal terminals of multiple selection circuits, respectively, control signals Ctr1, Ctr2, . . . , CtrN (denoted by Ctr in FIG. 8) are provided to N control signal terminals of each selection circuit, respectively, and boost signals Bst1, Bst2, ..., BstM (denoted by Bst in FIG. 8) are provided to M control signal terminals of each selection circuit.

The display device 800 may further include a display panel 830. The display panel 830 may receive the output signals of each selection circuit in the multiplexing circuit through a plurality of data lines D1, D2, ..., D3, respectively.

For example, as shown in FIG. 8, the driving circuit 820 generates three data signals as input signals F1, F2, and F3 and provides the input signals F1, F2, and F3 to the multiplexing circuit 810. The multiplexing circuit 810 is used to multiplex the input signals F1, F2, and F3 into six data signals under a control of the control signal Ctr and the boost signal Bst, and the six data signals are output to the data lines D1 to D6, respectively, so as to be provided to different pixel columns on the display panel 830 to drive the display panel to display.

FIG. 9 shows a flowchart of a method for driving a selection circuit according to the embodiments of the present disclosure. The method is applicable to the selection circuit of any of the above-mentioned embodiments.

In step S910, N control signals and M boost signals are provided to the selection circuit, and each booster circuit receives one of the control signals and one of the boost signals, and provides the received control signal to the control terminal of the control circuit coupled to the booster circuit, and increases a potential at the control terminal of the control circuit coupled to the booster circuit by using the received boost signal during a period when the received control signal is at an effective level.

In step S920, an input signal is provided to the selection circuit, and each control circuit provides a signal at the input terminal of the control circuit to the output terminal of the control circuit under a control of a signal at the control terminal of the control circuit.

Figure 10:
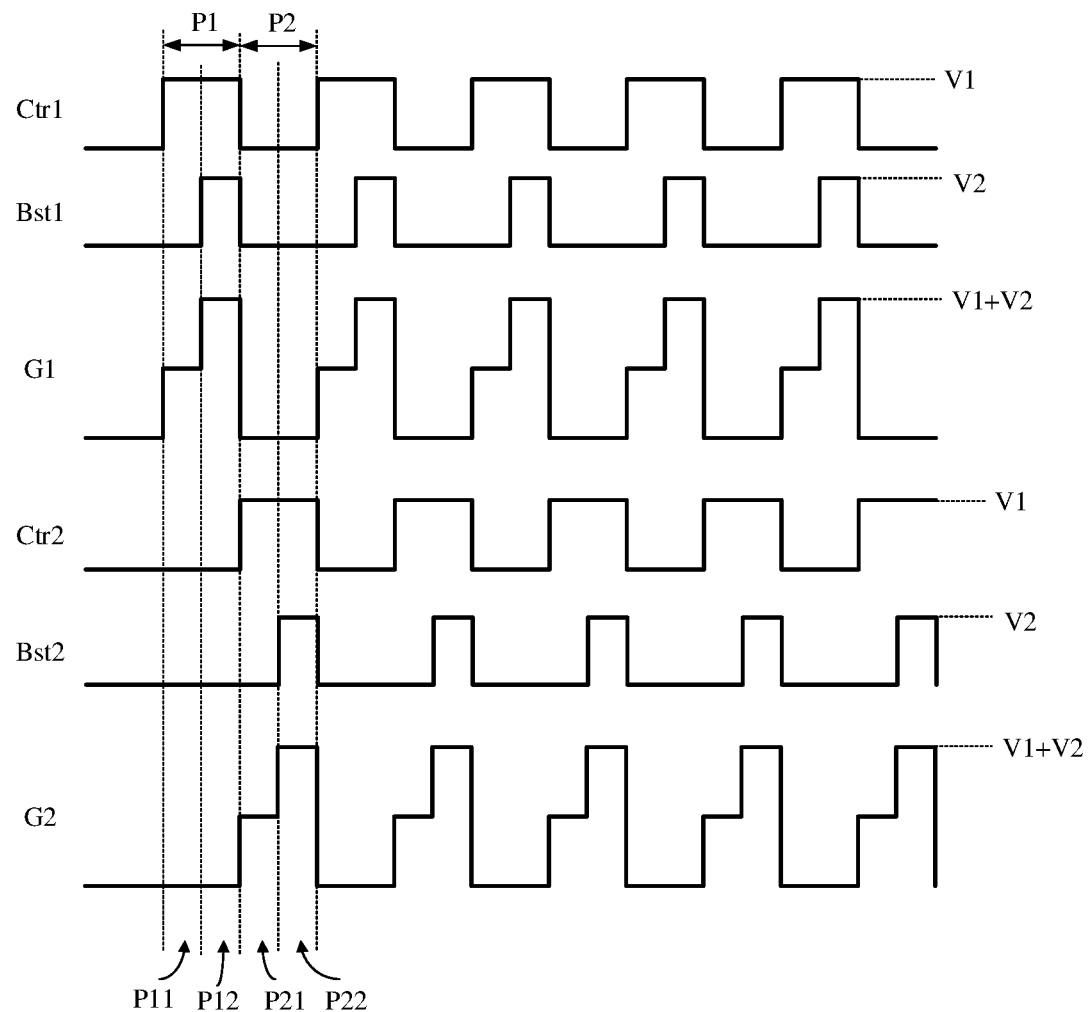
FIG. 10 shows a signal timing diagram of a selection circuit according to the embodiments of the present disclosure.

FIG. 10 shows a signal timing diagram of a selection circuit according to the embodiments of the present disclosure. The method is applicable to the selection circuit of any of the above-mentioned embodiments. The signal timing of FIG. 10 will be described below in conjunction with the selection circuit 300 of FIG. 3.

In a period P1, the first control signal Ctr1 is at a high level, and the second control signal Ctr2 is at a low level.

In a first sub-period P11 of the period P1, the first boost signal Bst1 is at a low level, the first transistor M1 and the fourth transistor M4 are turned on, and the second transistor M2 and the third transistor M3 are turned off, so that the first control signal Ctr1 being at a high level (for example, a level V1) is provided to the gate G1 of the fifth transistor M5, and the second control signal Ctr2 being at a low level is provided to the gate G2 of the sixth transistor M6. The high level of the gate G1 of the fifth transistor M5 turns on the fifth transistor M5, thereby providing the input signal IN to the second electrode of the fifth transistor M5 to be output as the first output signal OUT1. The low level of the gate G2 of the sixth transistor M6 turns off the sixth transistor M6.

In a second sub-period P12 of the period P1, the first boost signal Bst1 changes from being at a low level to be at a high level (for example, a level V2). Due to a bootstrap effect of the first capacitor C1, a potential at the gate G1 of the fifth transistor M5 is further increased (for example, to V1+V2). It can be seen that, compared to the high level value V1 of the first control signal, the potential at the gate G1 of the fifth transistor M5 is increased, so that the current passing through the fifth transistor M5 increases, thereby reducing an attenuation of the output signal OUT1 relative to the input signal IN. The increased value of the potential at the gate G1 of the fifth transistor M5 may be adjusted by adjusting the first capacitor C1. In some embodiments, the increased value of the potential at the gate G1 of the fifth transistor M5 may also be adjusted by adjusting the high level value (for example, V2) of the first boost signal.

In the period P2, the first control signal Ctr1 is at a low level, and the second control signal Ctr2 is at a high level.

In a first sub-period P21 of the period P2, the second boost signal Bst2 is at a low level, the first transistor M1 and the fourth transistor M4 are turned on, and the second transistor M2 and the third transistor M3 are turned off, so that the first control signal Ctr1 being at a low level is provided to the gate G1 of the fifth transistor M5, and the second control signal Ctr2 being at a high level (for example, the level V1) is provided to the gate G2 of the sixth transistor M6. The low level of the gate G1 of the fifth transistor M5 turns off the fifth transistor M5. The high level of the gate G2 of the sixth transistor M6 turns on the sixth transistor M6, thereby providing the input signal IN to the second electrode of the sixth transistor M6 to be output as the second output signal OUT2.

In a second sub-period P22 of the period P2, the second boost signal Bst2 changes from being at a low level to be at a high level (for example, the level V2). Due to the bootstrap effect of the second capacitor C2, a potential at the gate G2 of the sixth transistor M6 is further increased (for example, to V1+V2). The increased value of the potential at the gate G2 of the sixth transistor M6 may be adjusted by adjusting the first capacitor C2. In some embodiments, the increased value of the potential at the gate G2 of the sixth transistor M6 may also be adjusted by adjusting the high level value (for example, V2) of the second boost signal. It can be seen that compared to the high level value V1 of the first control signal, the potential at the gate G2 of the sixth transistor M6 is increased, so that the current passing through the sixth transistor M6 is increased, thereby reducing an attenuation of the second output signal OUT2 relative to the input signal IN.

In some embodiments, the first boost signal Bst1 is at a high level during at least a part of the period during which the first control signal Ctr1 is at a high level, and the second boost signal Bst2 is at a high level during at least a part of the period during which the second control signal Ctr2 is at a high level. For example, as shown in FIG. 10, a high-level duration of the first boost signal Bst1 may be approximately half of a high-level duration of the first control signal Ctr1, and the first boost signal Bst1 changes to be at a high level after the first control signal Ctr1 changes to at a high level for a period of time, and changes to be at a low level at the same time as the first control signal Ctr1. That is, the first half of the first period P1 may be regarded as the first sub-period P11, and the second half may be regarded as the second sub-period P22. The second boost signal Bst2 is set in a similar manner. In this way, the nodes G1 and G2 may be boosted by the respective boost signals after being charged to a sufficient level by the respective control signals, so as to reach the desired voltage level. However, the embodiments of the present disclosure are not limited to this, and a relationship between the boost signal and the control signal may be set as desired, as long as the high-level duration of the first boost signal Bst1 falls within the high-level duration of the first control signal Ctr1 and is shorter than the high-level duration of the first control signal Ctr1, so that the first booster circuit 320_1 may further increase the potential at the node G while the node G1 is at a high level by using the first boost signal Bst1, and similarly, the high-level duration of the second boost signal Bst2 falls within the high-level duration of the second control signal Ctr2 and is shorter than the high-level duration of the second control signal Ctr2.

Although the selection circuit 300 of FIG. 3 is used as an example to describe the signal timing, the embodiments of the present disclosure are not limited to this. The selection circuit 400 may have similar signal timing. An amplitude, a phase, and a duty cycle of the control signal and the boost signal may also be set as desired. For example, a high level of each control signal and boost signal may be set in the range of 16V to 30V, and a low level of each control signal and boost signal may be set in the range of −15V to −8V. For example, the high level value of each control signal and boost signal may be set to 20V, and the low level value may be set to −8V. Then, the booster circuit may boost the potential at the control terminal to 40V.

Figure 11:
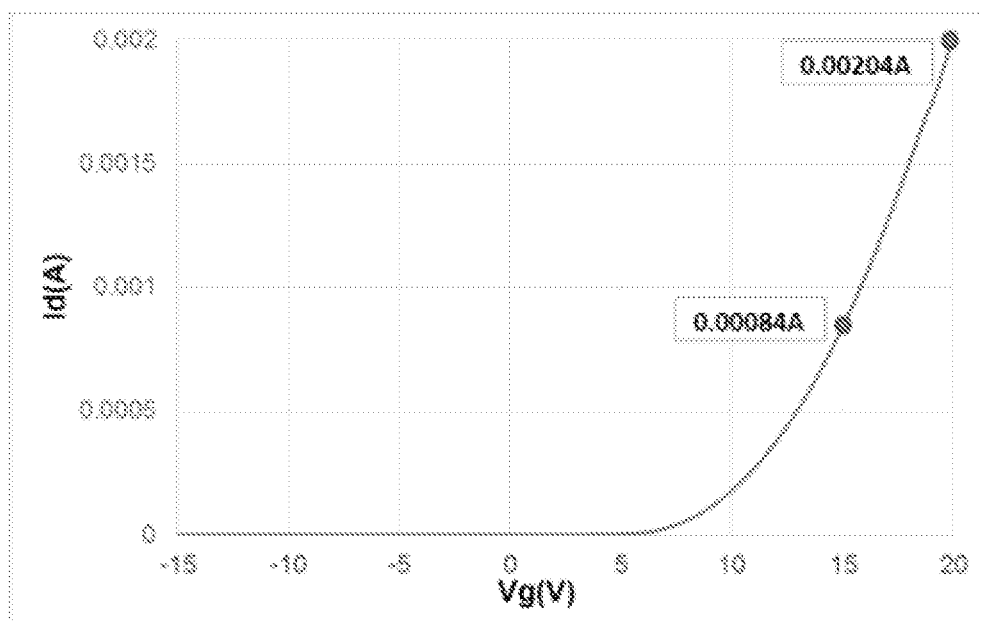
FIG. 11 shows a graph of a relationship between a gate-source voltage and a current of a transistor in a control circuit of a selection circuit according to the embodiments of the present disclosure.

FIG. 11 shows a graph of a relationship between a gate-source voltage and a current of the transistor in a control circuit of a selection circuit according to the embodiments of the present disclosure. This graph is applicable to the fifth transistor and the sixth transistor of the control circuit in the selection circuit of any of the above-mentioned embodiments, for example, the fifth transistor M5 and the sixth transistor M6 described above.

It can be seen from FIG. 11 that as a gate-source voltage Vg (a voltage difference between the gate and the source) of the fifth transistor increases, a current Id passing through the fifth transistor increases significantly. As the gate-source voltage increases from 15V to 20V, the current Id increases from 0.84 mA to 2.04 mA, an increase of 140%. It can be seen that the embodiments of the present disclosure can effectively increase the current passing through the fifth transistor M5 and the sixth transistor M6 by increasing the gate voltage of the fifth transistor M5 and the gate voltage of the sixth transistor M6, thereby reducing the signal attenuation at the signal output terminal.

Those skilled in the art may understand that the embodiments described above are all exemplary, and those skilled in the art may improve them, and the structures described in the various embodiments can be freely combined without conflicts in structure or principle.

After describing the preferred embodiments of the present disclosure in detail, those skilled in the art may clearly understand that various changes and modifications may be made without departing from the scope and spirit of the appended claims, and the present disclosure is not limited to the implementations of the exemplary embodiments cited in the specification.

What is claimed is:

1. A selection circuit, comprising:
N control circuits, wherein each control circuit of the N control circuits is configured to provide a signal at an input terminal of the control circuit to an output terminal of the control circuit under control of a signal at a control terminal of the control circuit, and each of input terminals of the N control circuits is coupled to receive an input signal, and output terminals of the N control circuits are coupled to output N output signals respectively, wherein N is an integer greater than 1; and
M booster circuits, wherein control terminals of M control circuits among the N control circuits are coupled to output terminals of the M booster circuits, respectively, and first input terminals of the M booster circuits are coupled to receive M control signals among N control signals, respectively, second input terminals of the M booster circuits are coupled to receive M boost signals, respectively, and control terminals of other control circuits among the N control circuits except for the M control circuits are coupled to receive other control signals among the N control signals except for the M control signals, wherein each booster circuit of the M booster circuits is configured to provide a received control signal to an output terminal of the booster circuit, and increase a potential at the output terminal of the booster circuit by using a received boost signal, wherein M is an integer and 1≤M≤N;

wherein:
M=2, N=2, the N control circuits comprise a first control circuit and a second control circuit, the M booster circuits comprise a first booster circuit and a second booster circuit, the N control signals comprise a first control signal and a second control signal, the M boost signals comprise a first boost signal and a second boost signal, and the N output signals comprise a first output signal and a second output signal;
a control terminal of the first control circuit is coupled to an output terminal of the first booster circuit, an input terminal of the first control circuit is coupled to receive the input signal, an output terminal of the first control circuit is coupled to output the first output signal, a first input terminal of the first booster circuit is coupled to receive the first control signal, and a second input terminal of the first booster circuit is coupled to receive the first boost signal; and
a control terminal of the second control circuit is coupled to an output terminal of the second booster circuit, an input terminal of the second control circuit is coupled to receive the input signal, an output terminal of the second control circuit is coupled to output the second output signal, a first input terminal of the second booster circuit is coupled to receive the second control signal, and a second input terminal of the second booster circuit is coupled to receive the second boost signal; and wherein the first booster circuit comprises:
a first transistor, wherein a gate of the first transistor and a first electrode of the first transistor are coupled to receive the first control signal, and a second electrode of the first transistor is coupled to the control terminal of the first control circuit;
a second transistor, wherein a gate of the second transistor is coupled to receive the second control signal, a first electrode of the second transistor is coupled to receive the first control signal, and a second electrode of the second transistor is coupled to the control terminal of the first control circuit; and
a first capacitor, wherein a first terminal of the first capacitor is coupled to the control terminal of the first control circuit, and a second terminal of the first capacitor is coupled to receive the first boost signal.

2. The selection circuit according to claim 1, wherein the second booster circuit comprises:
a third transistor, wherein a gate of the third transistor and a first electrode of the third transistor are coupled to receive the second control signal, and a second electrode of the third transistor is coupled to the control terminal of the second control circuit;
a fourth transistor, wherein a gate of the fourth transistor is coupled to receive the first control signal, a first electrode of the fourth transistor is coupled to receive the second control signal, and a second electrode of the fourth transistor is coupled to the control terminal of the second control circuit; and a second capacitor, wherein a first terminal of the second capacitor is coupled to the control terminal of the second control circuit, and a second terminal of the second capacitor is coupled to receive the second boost signal.

3. The selection circuit according to claim 1, wherein the first control circuit comprises a fifth transistor, and a gate of the fifth transistor is used as the control terminal of the first control circuit, a first electrode of the fifth transistor is used as the input terminal of the first control circuit, and a second electrode of the fifth transistor is used as the output terminal of the first control circuit; and the second control circuit comprises a sixth transistor, and a gate of the sixth transistor is used as the control terminal of the second control circuit, a first electrode of the sixth transistor is used as the input terminal of the second control circuit, and a second electrode of the sixth transistor is used as the output terminal of the second control circuit.

4. A multiplexing circuit comprising at least one selection circuit according to claim 1.

5. A method for controlling the selection circuit according to claim 1, comprising:

providing N control signals and M boost signals to the selection circuit, wherein each booster circuit receives one of the N control signals and one of the M boost signals, and provides a received control signal to the control terminal of the control circuit coupled to the booster circuit, and increases a potential at the control terminal of the control circuit coupled to the booster circuit by using a received boost signal during a period when the received control signal is at an effective level; and providing an input signal to the selection circuit, wherein each control circuit provides a signal at the input terminal of the control circuit to the output terminal of the control circuit under control of a signal at the control terminal of the control circuit.

6. A selection circuit, comprising:

N control circuits, wherein each control circuit of the N control circuits is configured to provide a signal at an input terminal of the control circuit to an output terminal of the control circuit under control of a signal at a control terminal of the control circuit, and each of input terminals of the N control circuits is coupled to receive an input signal, and output terminals of the N control circuits are coupled to output N output signals respectively, wherein N is an integer greater than 1; and M booster circuits, wherein control terminals of M control circuits among the N control circuits are coupled to output terminals of the M booster circuits, respectively, and first input terminals of the M booster circuits are coupled to receive M control signals among N control signals, respectively, second input terminals of the M booster circuits are coupled to receive M boost signals, respectively, and control terminals of other control circuits among the N control circuits except for the M control circuits are coupled to receive other control signals among the N control signals except for the M control signals, wherein each booster circuit of the M booster circuits is configured to provide a received control signal to an output terminal of the booster circuit, and increase a potential at the output terminal of the booster circuit by using a received boost signal, wherein M is an integer and 1≤M≤N;

wherein:

M=1, N=2, the N control circuits comprise a first control circuit and a second control circuit, and the M booster circuit comprises a first booster circuit, the N control signals comprise a first control signal and a second control signal, the M boost signal comprises a first boost signal, and the N output signals comprise a first output signal and a second output signal;

a control terminal of the first control circuit is coupled to an output terminal of the first booster circuit, an input terminal of the first control circuit is coupled to receive the input signal, and an output terminal of the first control circuit is coupled to output the first output signal, a first input terminal of the first booster circuit is coupled to receive the first control signal, and a second input terminal of the first booster circuit is coupled to receive the first boost signal; and a control terminal of the second control circuit is coupled to receive the second control signal, an input terminal of the second control circuit is coupled to receive the input signal, and an output terminal of the second control circuit is coupled to output the second output signal; and wherein the first booster circuit comprises:

a first transistor, wherein a gate of the first transistor and a first electrode of the first transistor are coupled to receive the first control signal, and a second electrode of the first transistor is coupled to the control terminal of the first control circuit;

a second transistor, wherein a gate of the second transistor is coupled to receive the second control signal, a first electrode of the second transistor is coupled to receive the first control signal, and a second electrode of the second transistor is coupled to the control terminal of the first control circuit; and a first capacitor, wherein a first terminal of the first capacitor is coupled to the control terminal of the first control circuit, and a second terminal of the first capacitor is coupled to receive the first boost signal.

7. The selection circuit according to claim 6, wherein:

the first control circuit comprises a fifth transistor, and a gate of the fifth transistor is used as the control terminal of the first control circuit, a first electrode of the fifth transistor is used as the input terminal of the first control circuit, and a second electrode of the fifth transistor is used as the output terminal of the first control circuit; and the second control circuit comprises a sixth transistor, and a gate of the sixth transistor is used as the control terminal of the second control circuit, a first electrode of the sixth transistor is used as the input terminal of the second control circuit, and a second electrode of the sixth transistor is used as the output terminal of the second control circuit.

8. A multiplexing circuit comprising at least one selection circuit according to claim 6.

9. A selection circuit, comprising:

N control circuits, wherein each control circuit of the N control circuits is configured to provide a signal at an input terminal of the control circuit to an output terminal of the control circuit under control of a signal at a control terminal of the control circuit, and each of input terminals of the N control circuits is coupled to receive an input signal, and output terminals of the N control circuits are coupled to output N output signals respectively, wherein N is an integer greater than 1; and M booster circuits, wherein control terminals of M control circuits among the N control circuits are coupled to output terminals of the M booster circuits, respectively, and first input terminals of the M booster circuits are coupled to receive M control signals among N control signals, respectively, second input terminals of the M booster circuits are coupled to receive M boost signals, respectively, and control terminals of other control circuits among the N control circuits except for the M control circuits are coupled to receive other control signals among the N control signals except for the M control signals, wherein each booster circuit of the M booster circuits is configured to provide a received control signal to an output terminal of the booster circuit, and increase a potential at the output terminal of the booster circuit by using a received boost signal, wherein M is an integer and 1≤M≤N;

wherein:
- M=1, N=2, the N control circuits comprise a first control circuit and a second control circuit, and the M booster circuit comprises a second booster circuit, the N control signals comprise a first control signal and a second control signal, the M boost signal comprises a second boost signal, and the N output signals comprise a first output signal and a second output signal;
- a control terminal of the first control circuit is coupled to receive the first control signal, an input terminal of the first control circuit is coupled to receive the input signal, and an output terminal of the first control circuit is coupled to output the first output signal; and
- a control terminal of the second control circuit is coupled to an output terminal of the second booster circuit, an input terminal of the second control circuit is coupled to receive the input signal, and an output terminal of the second control circuit is coupled to output the second output signal, a first input terminal of the second booster circuit is coupled to receive the second control signal, and a second input terminal of the second booster circuit is coupled to receive the second boost signal; and wherein the second booster circuit comprises:
- a third transistor, wherein a gate of the third transistor and a first electrode of the third transistor are coupled to receive the second control signal, and a second electrode of the third transistor is coupled to the control terminal of the second control circuit;
- a fourth transistor, wherein a gate of the fourth transistor is coupled to receive the first control signal, a first electrode of the fourth transistor is coupled to receive the second control signal, and a second electrode of the fourth transistor is coupled to the control terminal of the second control circuit; and
- a second capacitor, wherein a first terminal of the second capacitor is coupled to the control terminal of the second control circuit, and a second terminal of the second capacitor is coupled to receive the second boost signal.

10. The selection circuit according to claim 9, wherein:
the first control circuit comprises a fifth transistor, and a gate of the fifth transistor is used as the control terminal of the first control circuit, a first electrode of the fifth transistor is used as the input terminal of the first control circuit, and a second electrode of the fifth transistor is used as the output terminal of the first control circuit; and
the second control circuit comprises a sixth transistor, and a gate of the sixth transistor is used as the control terminal of the second control circuit, a first electrode of the sixth transistor is used as the input terminal of the second control circuit, and a second electrode of the sixth transistor is used as the output terminal of the second control circuit.

11. A multiplexing circuit comprising at least one selection circuit according to claim 9.

* * * * *